(12) United States Patent
Sato

(10) Patent No.: US 10,043,697 B2
(45) Date of Patent: Aug. 7, 2018

(54) SUBSTRATE PROCESSING APPARATUS AND ARTICLE MANUFACTURING METHOD

(71) Applicant: CANON KABUSHIKI KAISHA, Tokyo (JP)

(72) Inventor: Masato Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/585,408

(22) Filed: May 3, 2017

(65) Prior Publication Data
US 2017/0323816 A1    Nov. 9, 2017

(30) Foreign Application Priority Data

May 9, 2016 (JP) .................. 2016-094153

(51) Int. Cl.
| | | |
|---|---|---|
| B65G 49/05 | (2006.01) |
| B65G 37/00 | (2006.01) |
| B65G 47/90 | (2006.01) |
| H01L 21/677 | (2006.01) |
| H01L 21/67 | (2006.01) |
| H01L 21/68 | (2006.01) |
| H01L 21/70 | (2006.01) |

(52) U.S. Cl.
CPC ........ H01L 21/67706 (2013.01); B65G 49/05 (2013.01); H01L 21/67 (2013.01); H01L 21/67011 (2013.01); H01L 21/67167 (2013.01); H01L 21/67236 (2013.01); H01L 21/68 (2013.01); H01L 21/70 (2013.01)

(58) Field of Classification Search
None
See application file for complete search history.

(56) References Cited

U.S. PATENT DOCUMENTS 6,319,322 B1 * 11/2001 Ueda ................. H01L 21/67109
118/319
2012/0109355 A1 * 5/2012 Baccini ............. H01L 21/67173
700/108
2013/0101738 A1 * 4/2013 Sollner ............. H01L 21/67748
427/256

FOREIGN PATENT DOCUMENTS

JP           2936885 B2      8/1999
JP        2012009831 A       1/2012

* cited by examiner

*Primary Examiner* — Kavel Singh
(74) *Attorney, Agent, or Firm* — Rossi, Kimms & McDowell LLP

(57) ABSTRACT

A substrate processing apparatus including a plurality of processing devices each of which processes a substrate is provided. The apparatus comprises a conveying device including a conveyance path and conveys, to one of the plurality of processing devices, a substrate conveyed into one end of the conveyance path from an outside of the substrate processing apparatus, and an adjusting device configured to perform adjustment of a pre-alignment state of the substrate conveyed from the one end and to be conveyed into one of the plurality of processing devices, wherein the adjusting device is arranged on the conveyance path and between a processing devices of the plurality of processing devices, farthest from the one end, and a processing device, of the plurality of processing devices, closest to the one end.

14 Claims, 9 Drawing Sheets

SUBSTRATE PROCESSING APPARATUS AND ARTICLE MANUFACTURING METHOD

BACKGROUND OF THE INVENTION

Field of the Invention

The present invention relates to a substrate processing apparatus including a plurality of processing devices each for processing a substrate, and an article manufacturing method of manufacturing an article using the substrate processing apparatus.

Description of the Related Art

For a substrate processing apparatus for processing a substrate, there is known an arrangement in which pre-alignment (alignment before conveyance) of a substrate is performed to make the position accuracy of the substrate conveyed into a processing device fall within the tolerance (see Japanese Patent No. 2936885).

For processing a substrate for the purpose of improving the throughput, there is provided a substrate processing apparatus having a so-called cluster structure including a plurality of processing devices each for processing a substrate (see Japanese Patent Laid-Open No. 2012-009831).

In the substrate processing apparatus having the cluster structure, if a pre-alignment unit is arranged in each processing device, the installation area (footprint) increases as the number of processing devices increases.

SUMMARY OF THE INVENTION

The present invention provides, for example, a substrate processing apparatus advantageous in compatibility between a footprint thereof and a substrate pre-alignment precision thereof.

According to one aspect of the present invention, a substrate processing apparatus including a plurality of processing devices each of which processes a substrate is provided. The apparatus comprises a conveying device including a conveyance path and configured to convey, to one of the plurality of processing devices, a substrate conveyed into one end of the conveyance path from an outside of the substrate processing apparatus, and an adjusting device configured to perform adjustment of a pre-alignment state of the substrate conveyed from the one end and to be conveyed into one of the plurality of processing devices, wherein the adjusting device is arranged on the conveyance path and between a processing device, of the plurality of processing devices, farthest from the one end, and a processing device, of the plurality of processing devices, closest to the one end.

Further features of the present invention will become apparent from the following description of exemplary embodiments (with reference to the attached drawings).

DESCRIPTION OF THE EMBODIMENTS

Various exemplary embodiments, features, and aspects of the invention will be described in detail below with reference to the drawings.

Embodiments of the present invention will be described in detail below with reference to the accompanying drawings. Note that the following embodiments are merely practical examples advantageous when carrying out the present invention and the present invention is not limited to these embodiments. Furthermore, not all combinations of features explained in the following embodiments are essential for the present invention to solve the problem.

Figure 1:
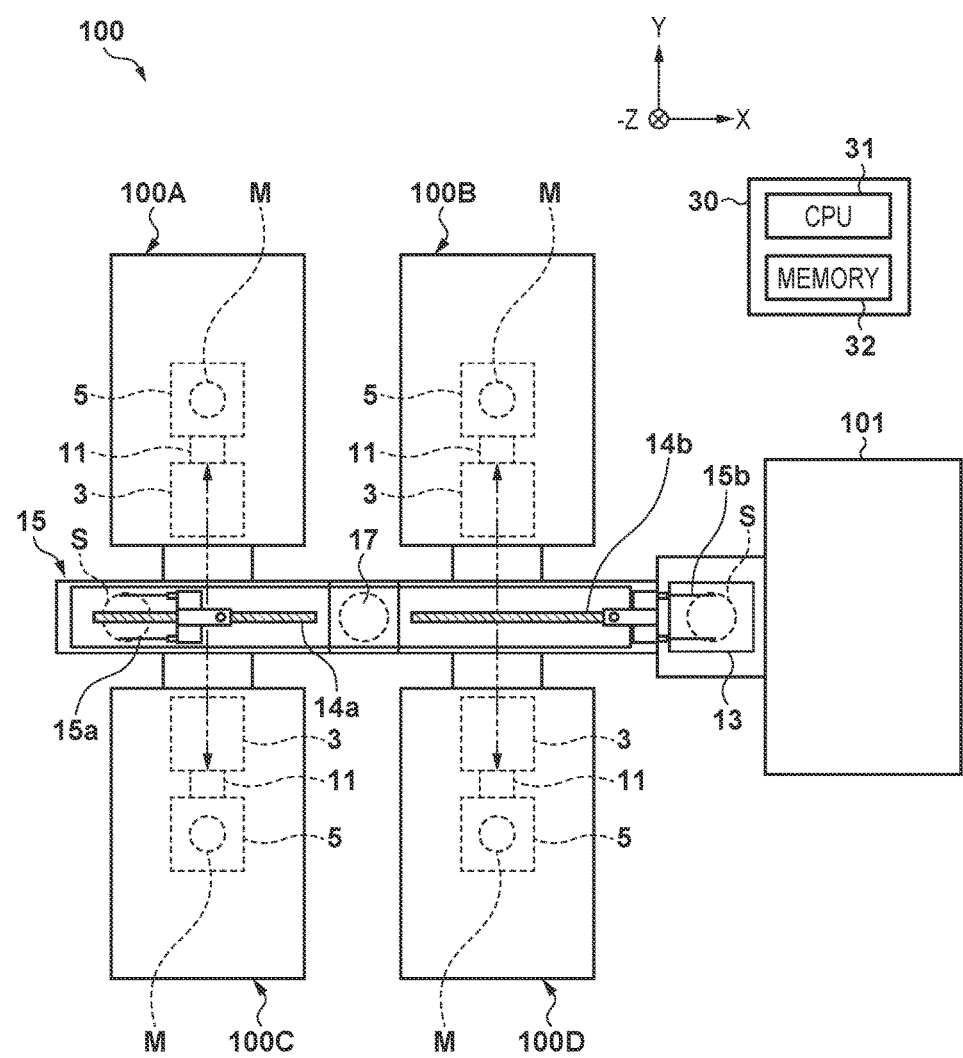
FIG. 1 is a view showing the schematic arrangement of a substrate processing apparatus according to an embodiment.

FIG. 1 is a view showing the schematic arrangement of a substrate processing apparatus 100 according to an embodiment. The substrate processing apparatus 100 includes a plurality of processing devices 100A, 100B, 100C, and 100D each for processing a substrate, and has a cluster structure which can parallelly process a plurality of substrates. Each processing device can be, for example, one of a lithography apparatus (an imprint apparatus, an exposure apparatus, a charged particle beam drawing apparatus, or the like), a deposition apparatus (a CVD apparatus or the like), a machining apparatus (a laser machining apparatus or the like), and an inspection apparatus (an overlay inspection apparatus or the like). The imprint apparatus forms a pattern on a substrate by curing an imprint material such as a resin supplied onto the substrate while a mold (original) is in contact with the resin. The exposure apparatus forms a latent image corresponding to the pattern of the original on a photoresist supplied onto the substrate by exposing the photoresist through the original. The charged particle beam drawing apparatus forms a latent image on a photoresist supplied onto the substrate by drawing a pattern on the photoresist with a charged particle beam.

To provide a practical example, an example in which each of the plurality of processing devices 100A, 100B, 100C, and 100D is formed as an imprint apparatus which is one of lithography apparatuses will be described below. Note that each of the plurality of processing devices 100A, 100B, 100C, and 100D may be formed as another type of lithography apparatus or another apparatus such as a deposition apparatus, machining apparatus, or inspection apparatus.

Figure 2:
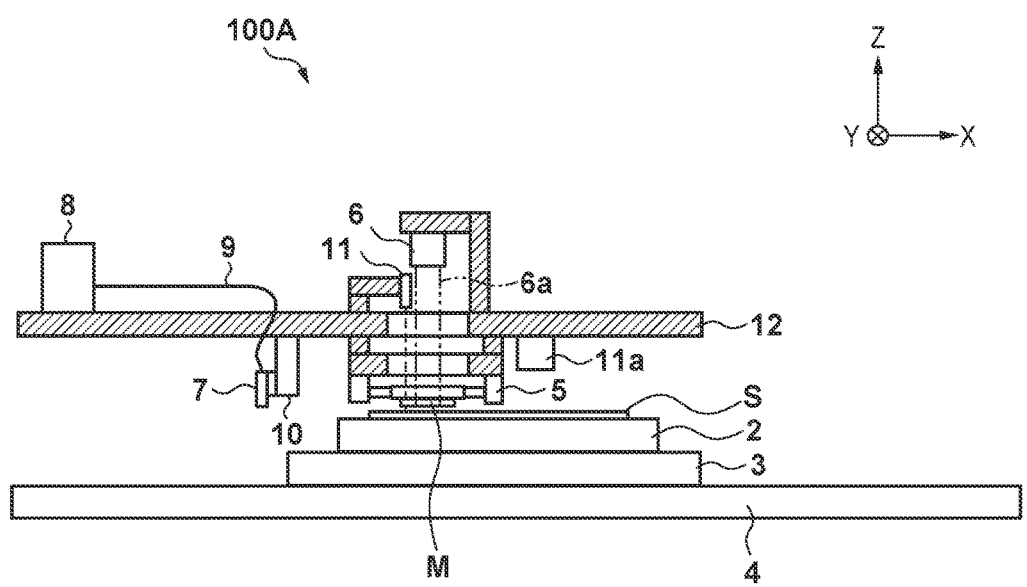
FIG. 2 is a view showing the schematic arrangement of an imprint apparatus according to the embodiment.

FIG. 2 is a view showing the schematic arrangement of the imprint apparatus formed as the processing device 100A. Note that the imprint apparatuses formed as the remaining processing devices 100B, 100C, and 100D have the same arrangement and a description thereof will be omitted.

The processing device 100A serving as an imprint apparatus is configured to perform patterning in a plurality of shot regions of a substrate S by repeating an imprint cycle. One imprint cycle indicates a cycle in which patterning is performed in one shot region of the substrate S by curing an imprint material on the substrate S while an original M is in contact with the imprint material. This can form a pattern corresponding to the pattern of the original on the surface layer of the substrate S. A substrate stage 3 moves the substrate S in the X-Y direction. A substrate holder 2 chucks and holds the substrate S. A base frame 4 supports the substrate stage 3 in the imprint apparatus.

An original driving device 5 is a driving device for driving the original in the vertical direction, and performs an operation of bringing the original M into contact with the imprint material on the substrate S. An ultraviolet light generator (ultraviolet light source) 6 irradiates the imprint material with ultraviolet light 6a via the original M to cure the imprint material. The ultraviolet light generator 6 includes a light source such as a halogen lamp for generating, for example, i-ray or g-ray as the ultraviolet light 6a, and a function of collecting and shaping the light generated by the light source. A dispenser 7 can discharge the imprint material as droplets, thereby placing (supplying) a predetermined amount of imprint material on the substrate S. The imprint material is stored in a tank 8, and supplied to the dispenser 7 via a pipe 9.

A moving device 10 moves the dispenser 7 between an imprint material discharging position and a retracting position (maintenance position). In a normal discharging operation, the dispenser 7 is positioned to the discharging position. When maintaining the dispenser 7, the dispenser 7 is moved to the retracting position (maintenance position) to clean or exchange it.

A substrate position detector (alignment detector) 11 can include a microscope for aligning the original M and the substrate S on which the dispenser 7 places the imprint material. The substrate position detector 11 causes the microscope to measure an overlay state between an alignment mark provided on the original M and an alignment mark on the substrate S, thereby aligning the alignment marks with each other. A method by image processing is appropriate as a measurement method. In this case, detection targets can include at least a positional shift in the X-Y direction and a shift in the θ direction. A positional shift in the vertical direction (Z direction) may also be added as a detection target. The processing device 100A may additionally include a microscope 11a for measuring an alignment mark on the substrate S in order to perform preliminary alignment to make the substrate fall within the measurement range of the substrate position detector 11. A base 12 supports and fixes the dispenser 7, tank 8, pipe 9, moving device 10, substrate position detector 11, microscope 11a, original M, and ultraviolet light generator 6.

Note that the above-described imprint apparatus has an arrangement for curing the imprint material using the wavelength range of ultraviolet light. The present invention, however, is not limited to this. For example, an imprint apparatus for curing the imprint material using a light beam in a wavelength range other than that of the ultraviolet light or an imprint apparatus for curing the imprint material by another energy such as heat energy may be used.

Referring back to FIG. 1, the substrate processing apparatus 100 includes a conveying device 15 which can convey, into one of the plurality of processing devices 100A to 100D, a substrate conveyed into one end of a conveyance path from the outside of the substrate processing apparatus. The conveying device 15 includes a first conveyance path 14a and a second conveyance path 14b which are separated by an adjusting device 17 (to be described later), a first conveying device 15a for conveying a substrate along the first conveyance path 14a, and a second conveying device 15b for conveying a substrate along the second conveyance path 14b. The first conveyance path 14a and the second conveyance path 14b can be formed as, for example, rails or traveling guides. Each of the first conveying device 15a and the second conveying device 15b includes a conveying hand having an arm which can stretch/contract and holds the substrate S. The conveying hand is configured to be movable in the vertical direction and around the vertical axis (θ direction). In the example of FIG. 1, a coating apparatus 101 serving as a preprocessing apparatus is connected to one end of the second conveyance path 14b via a substrate transferring device 13. Note that instead of the preprocessing apparatus, a container such as FOUP (Front Opening Unified Pod) may be connected to one end of the conveyance path.

A controller 30 comprehensively controls the plurality of processing devices 100A, 100B, 100C, and 100D, the coating apparatus 101, the conveying device 15, and the adjusting device 17 (to be described later). The controller 30 can include, for example, a CPU 31 serving as a central processing unit and a memory 32 which stores various data, programs, and the like.

The coating apparatus 101 forms an adhesion layer on the substrate to be processed. More specifically, before each of the plurality of processing devices 100A, 100B, 100C, and 100D places the imprint material on the substrate, the coating apparatus 101 coats the substrate with an adhesion layer. The purpose of this adhesion layer is, for example, to improve the adhesion between the imprint material and the substrate and improve the spread of the imprint material on the substrate surface. This adhesion layer includes a photoreactive monomolecular film or a reactive functional group, and is formed on the whole upper surface of the substrate S by spin coating by a coating device (not shown) in the coating apparatus 101.

The substrate processed by the coating apparatus 101 is conveyed to a selected one of the plurality of processing devices 100A, 100B, 100C, and 100D by the conveying device 15. Note that in terms of prevention of contamination by an impurity in the air, the time from coating with the adhesion layer to placement of the imprint material needs to be set to a predetermined time or shorter. For this purpose, a plurality of substrates each of which has been coated with the adhesion layer in the coating apparatus 101 are placed on the substrate transferring device 13 (storage device). The substrate transferring device 13 may be configured to receive the substrates one by one every time the substrate is coated with the adhesion layer, or configured to receive, at once, the plurality of substrates each coated with the adhesion layer and contain them in a containing case. Note that the coating apparatus 101 may additionally have development, baking, and substrate inspection functions.

The adjusting device 17 adjusts the pre-alignment state of the substrate to be conveyed from one end of the conveying device 15 into one of the plurality of processing devices 100A, 100B, 100C, and 100D. More specifically, for example, the adjusting device 17 adjusts the pre-alignment state including at least one of the position and rotation angle of the substrate extracted from the substrate transferring device 13 before conveying the substrate to a selected one of the plurality of processing devices 100A, 100B, 100C, and 100D. In an example, the adjusting device 17 includes a driver and a periphery sensor. While the driver drives the substrate S, the periphery sensor senses the periphery and notched portion or orientation flat of the substrate S. The controller 30 calculates the central position and rotation angle of the substrate S based on the sensing result, and the driver drives the substrate S to adjust the position and rotation angle of the substrate S based on the calculation result. This operation will be referred to as pre-alignment hereinafter.

In this embodiment, the adjusting device 17 is not provided for each of the plurality of processing devices 100A, 100B, 100C, and 100D. The adjusting devices 17, the number of which is smaller than that of the plurality of processing devices 100A, 100B, 100C, and 100D, are provided. For example, in the example of the arrangement shown in FIG. 1, only one adjusting device 17 is provided for the plurality of processing devices 100A, 100B, 100C, and 100D. In this example, the adjusting device 17 is arranged, on the conveyance path, between the processing devices, among the plurality of processing devices 100A, 100B, 100C, and 100D, which are farthest from and closest to one end of the conveyance path. For example, in the example of the arrangement shown in FIG. 1, the adjusting device 17 is arranged, on the conveyance path, at a central position in a region surrounded by the plurality of processing devices 100A, 100B, 100C, and 100D.

Note that each of the plurality of processing devices 100A, 100B, 100C, and 100D and the conveying device 15 may be covered with a chamber having a dust-removing air-conditioning function to prevent contamination by particles. Furthermore, to maintain a cleaner environment, the overall substrate processing apparatus 100 may be covered with a chamber.

An example of the operation of the substrate processing apparatus 100 will be described below with reference to FIG. 3. As described above, before each of the plurality of processing devices 100A, 100B, 100C, and 100D places the imprint material on a substrate, the coating apparatus 101 performs coating of an adhesion layer on the substrate, and the substrate having undergone coating of the adhesion layer is placed on the substrate transferring device 13. After that, the controller 30 selects one of the plurality of processing devices 100A, 100B, 100C, and 100D, into which the substrate to be processed is loaded (step S301). In this example, for example, in consideration of the conveyance time, a distance from the coating apparatus 101 to each processing device can be used as a processing device selection criterion. More specifically, the processing devices are sequentially selected from the processing device (in the example of FIG. 1, 100A or 100C) farthest from the coating apparatus 101 to the processing device (in the example of FIG. 1, 100B or 100D) closest to the coating apparatus 101. Alternatively, for example, in consideration of the processing time of each processing device, a selection criterion which also considers the processing time order may be provided. Note that step S301 may be performed after step S302 or S303 (to be described later). A case in which the processing device 100A is selected will be described below.

After the substrate is coated with the adhesion layer, the substrate S as the substrate to be processed, which is placed on the substrate transferring device 13, is conveyed to the adjusting device 17 by the conveying device 15b (step S302). The controller 30 controls the adjusting device 17 to perform pre-alignment for the substrate S (step S303).

Next, the first conveying device 15a travels on the first conveyance path 14a while holding the substrate S, moves to the processing device 100A selected in step S301, and places the substrate S on the substrate stage 3 of the processing device 100A by using the driving capabilities in the vertical direction and θ direction of the arm (step S304). The substrate holder on the substrate stage 3 chucks and holds the substrate S.

The controller 30 drives the substrate stage 3 of the processing device 100A into which the substrate S has been conveyed, thereby moving the substrate S to the position of the substrate position detector 11. After that, the substrate position detector 11 detects the position of the substrate S to perform alignment (step S305). As described above, alignment is performed by, for example, measuring, by the microscope provided in the substrate position detector 11, the relative positional relation between an alignment mark on the original M and an alignment mark on the substrate S, and correcting a shift between the alignment marks.

After the end of the alignment of the substrate in the processing device 100A in step S305, the processing device 100A moves the position of the substrate stage 3 to a predetermined position, and performs an imprint process (step S306). At this time, a force is applied to the substrate by pressing and releasing, and the pattern overlay positions of the original and substrate may shift. To cope with this, before or during pressing of each shot, the microscope 11a shown in FIG. 2 may measure an alignment mark of the shot, and the shift of the substrate may be corrected. After the imprint process is performed, the substrate S is unloaded outside the substrate processing apparatus 100 by the conveying device 15a or 15b (step S307).

In the above processing, alignment of the substrate is performed in each of steps S303, S305, and S306. More accurate substrate alignment is required in step S305 than in step S303, and is required in step S306 than in step S305. The alignment processes in steps S303, S305, and S306 respectively correspond to the mechanical pre-alignment process, TV pre-alignment process, and fine alignment process of the conventional lithography apparatus. If an alignment unit used in each alignment process is provided for each of the plurality of processing devices, this apparatus is superior in terms of shortening of the alignment time and improvement of the alignment accuracy. This, however, increases the installation area (footprint) and cost.

To the contrary, in this embodiment, as described above, only one adjusting device 17 is provided for the plurality of processing devices. However, while this arrangement is advantageous in footprint, a conveyance route after alignment by the adjusting device 17 is long, and a positional shift in the middle of the route and deterioration in positional reproducibility are concerned. Therefore, if the one adjusting device 17 simply corresponds to the plurality of processing devices, for example, it may become difficult to make an alignment mark on the substrate fall within the field of view of the microscope as the substrate position detector 11 of each processing device. Furthermore, the problem that it is necessary to increase the stroke of the substrate stage or microscope may arise. These problems may decrease the productivity (throughput) and increase the cost.

The measurement result of the substrate position detector 11 can include errors with respect to the measurement result of the adjusting device 17. A breakdown of the errors is as follows.

(1) A traveling error of the first conveyance path 14a or the second conveyance path 14b
(2) A chucking error of the substrate holder 2
(3) A traveling error of the substrate stage 3
(4) An atmosphere difference between respective conveyance routes Note that the atmosphere difference in (4) above indicates, for example, a case in which there is a difference in temperature between spaces such as the adjusting device 17, the first conveyance path 14*a*, the second conveyance path 14*b*, and the processing devices 100A to 100D, through which the substrate passes through. The atmosphere difference such as a temperature difference may influence each mechanical structure or a position error caused by deformation of the substrate.

In this embodiment, to reduce errors in the alignment processes in steps S303 and S305 described above, an offset corresponding to each processing device is given to an adjustment amount in the adjusting device 17. Offset determination processing of determining an offset value for each processing device will be described with reference to FIG. 4.

First, the controller 30 selects one of the plurality of processing devices 100A, 100B, 100C, and 100D into which the substrate S is to be loaded (step S401). The substrate S may be a dedicated tool substrate. Note that selection of the processing device in step S401 may be performed after step S402 or S403 (to be described later). A case in which the processing device 100B is selected will be described below.

The substrate S placed on the substrate transferring device 13 is conveyed to the adjusting device 17 by the second conveying device 15*b* (step S402). The controller 30 controls the adjusting device 17 to perform pre-alignment for the substrate S (step S403).

The second conveying device 15*b* travels on the second conveyance path 14*b* while holding the substrate S, moves to the processing device 100B selected in step S401, and places the substrate S on the substrate stage 3 of the processing device 100B (step S404). The substrate holder on the substrate stage 3 chucks and holds the substrate S.

The controller 30 drives the substrate stage 3 of the processing device 100B into which the substrate S is conveyed, thereby moving the substrate S to the position of the substrate position detector 11. After that, the substrate position detector 11 detects the position of the substrate S (step S405).

The difference between the substrate position in pre-alignment in step S403 and the substrate position detected in step S405 can be the sum of the above-described various errors. The controller 30 determines whether the difference falls within the tolerance of the positional shift amount (step S406). The tolerance of the positional shift amount can be determined based on, for example, the driving stroke and the field of view of the microscope of the substrate position detector 11, the stroke of the stage, and the like. If the positional shift amount falls outside the tolerance, there is no mark in the field of view of the microscope, and thus the process returns to step S405 to move the substrate stage 3 to a position at which a mark falls in the field of view. With the above steps, the offset of the processing device is determined (step S407). The determined offset value is stored in the memory 32 of the controller 30 in association with the identifier of the processing device.

After that, the controller 30 determines whether the offsets of all the processing devices have been determined (step S408). If it is determined that the offsets of all the processing devices have been determined, the offset determination processing of the adjusting device 17 ends. If there remains a processing device for which the offset has not been determined, the process returns to step S401 to select the corresponding processing device, and then steps S402 to S407 are repeated. Note that determination of the offset values of all the processing devices is used as a determination criterion in step S408. However, determination of the offset value of only a designated processing device may be used as a determination criterion.

Figure 3:
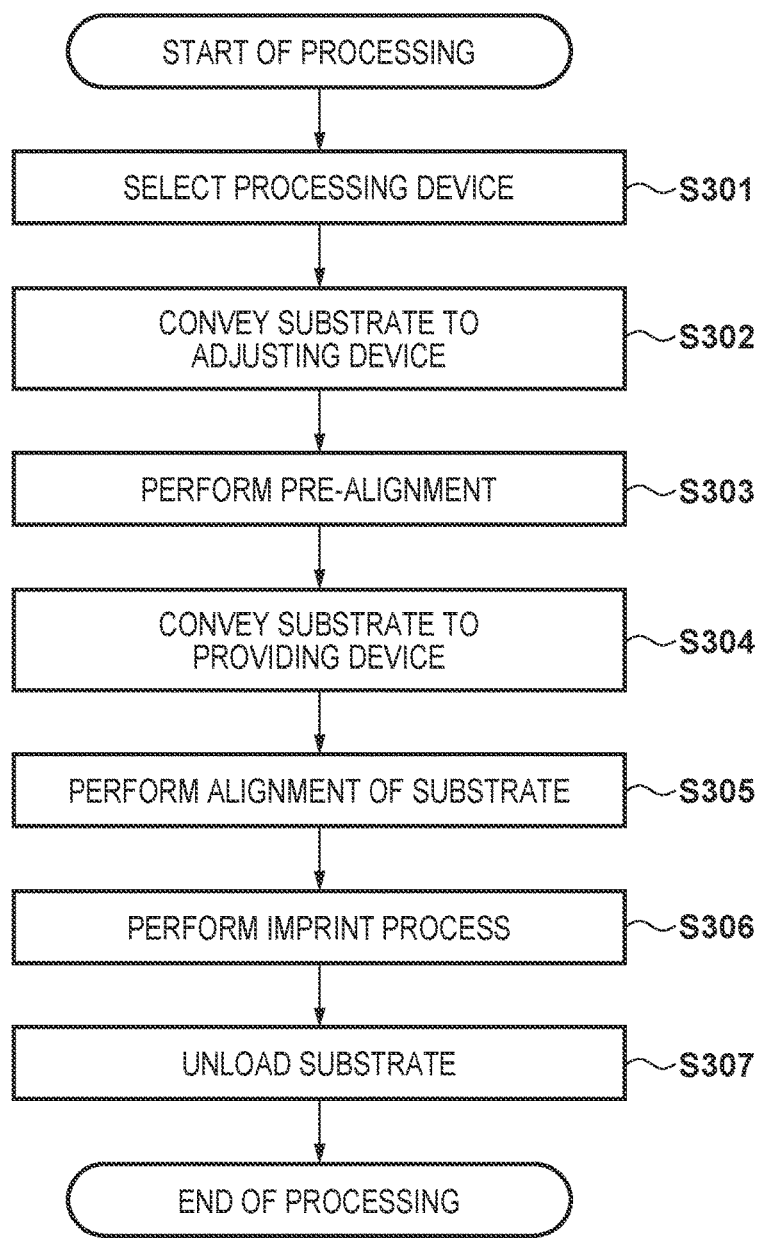
FIG. 3 is a flowchart for explaining the operation of the substrate processing apparatus according to the embodiment.

Among the offset values determined in the above-described offset determination processing, the offset value associated with the processing device selected in step S301 of FIG. 3 is read out from the memory 32, and added to the driving amount of the substrate in the pre-alignment process in step S303. Therefore, at this time, the controller 30 controls the adjusting device 17 to adjust, in accordance with the offset value for the selected processing device, at least one of the position and rotation angle of the substrate to be processed.

As described above, in the example of the arrangement shown in FIG. 1, the adjusting device 17 is arranged, on the conveyance path, at the central position in the region surrounded by the plurality of processing devices 100A, 100B, 100C, and 100D. This arranges the adjusting device 17 at a position which is sandwiched by the first conveyance path 14*a* and the second conveyance path 14*b* and at which the conveyance distances to the plurality of processing devices 100A, 100B, 100C, and 100D are equal to each other. When the adjusting device 17 is arranged at equal distances with respect to the conveyance routes to the respective processing devices, the traveling errors of the conveyance paths and atmosphere differences in the respective conveyance routes can be equalized, thereby decreasing the error factors. If linear guides or the like are used as the conveyance paths, a difference in rail parallelism between the conveyance routes can be reduced by arranging the adjusting device 17 at equal distances from the respective processing devices. When the conveyance routes have the equal distances, the volumes of the spaces of the respective conveyance routes become close to each other, thereby making it possible to reduce a difference in temperature control accuracy.

As described above, each of the first conveying device 15*a* and the second conveying device 15*b* has the conveying hand. The two conveying hands respectively travel on the two conveyance paths (first conveyance path 14*a* and second conveyance path 14*b*) sandwiching the adjusting device 17.

Figure 8:
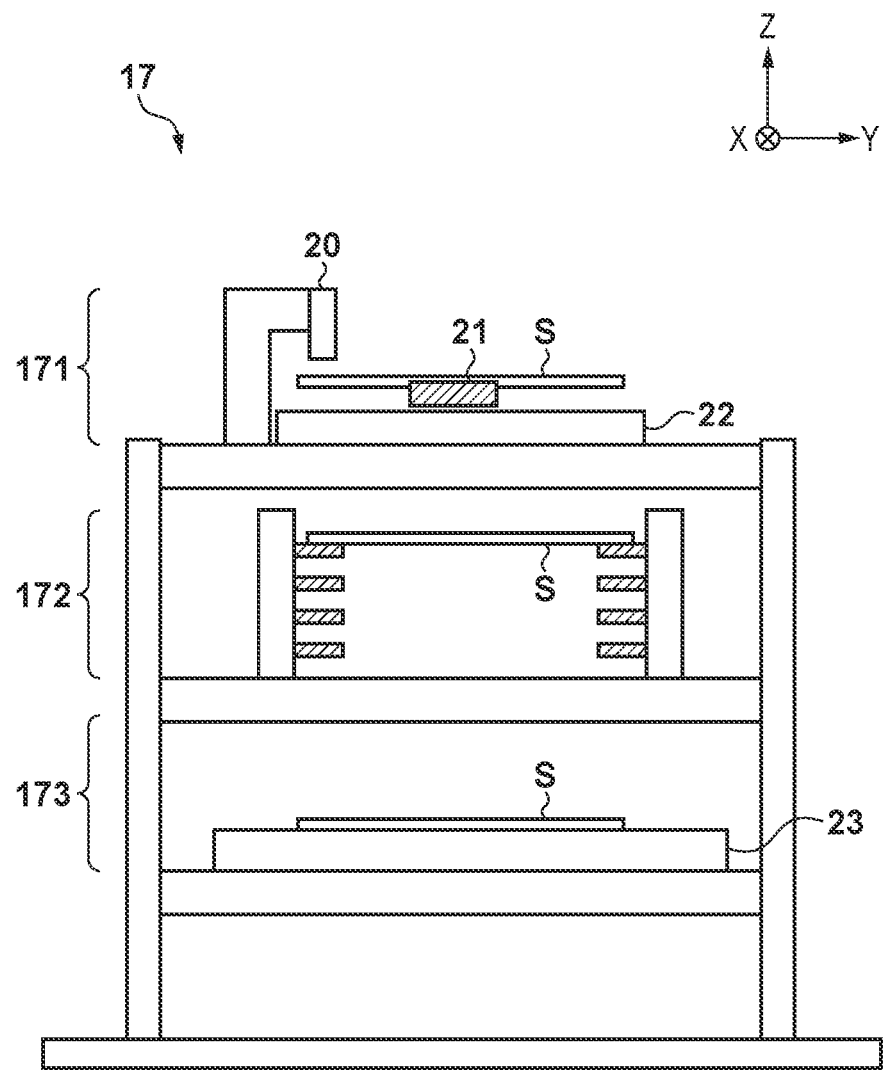
FIG. 8 is a view showing an example of the arrangement of an adjusting device including a substrate container and a substrate temperature regulator according to the embodiment.

The adjusting device 17 may be configured to have a temperature regulation function from the viewpoint of making the substrate temperature at the time of conveyance constant. In addition, the adjusting device 17 may be configured to include a substrate container capable of containing a plurality of substrates so as to adjust the timing of loading a substrate into each processing device from the viewpoint of maximizing the throughput. FIG. 8 shows an example of the arrangement of the adjusting device 17 including a pre-alignment unit 171, a substrate container 172, and a temperature regulator 173. The substrate S conveyed into the adjusting device 17 is placed on a temperature control plate 23 in the temperature regulator 173, and the temperature of the substrate S is regulated to fall within a set temperature range. After completion of temperature regulation, the substrate S is conveyed to the pre-alignment unit 171 by a conveying arm (not shown), and placed on a substrate holder 21. The substrate holder 21 chucks and holds the substrate S. The pre-alignment unit 171 includes a driver 22 for driving the substrate, and a periphery sensor 20 for sensing the periphery and notch or orientation flat of the substrate, and performs pre-alignment described above.

Under the control of the controller 30, the substrate S can be temporarily contained in the substrate container 172 in accordance with processing statuses in the respective processing devices. For example, the controller 30 can control the adjusting device 17 to contain the substrate in the substrate container 172 during a wanting time when all of the plurality of processing devices 100A, 100B, 100C, and 100D are processing the substrates. At this time, in accordance with the processing statuses in the respective processing devices, the controller 30 can contain, in the substrate container 172, the substrate before pre-alignment processing or the substrate after pre-alignment processing. The controller 30 can store, in the memory 32, for each substrate contained in the substrate container 172, management information indicating whether the substrate is before or after pre-alignment processing. If one of the plurality of processing devices enters a processible state, the controller 30 controls, based on the management information, the adjusting device 17 and the conveying device 15 to designate the substrate having undergone adjustment in the adjusting device 17, and convey it from the substrate container 172 to the processing device. Thus, the throughput of the substrate processing apparatus 100 is maximized.

Figure 4:
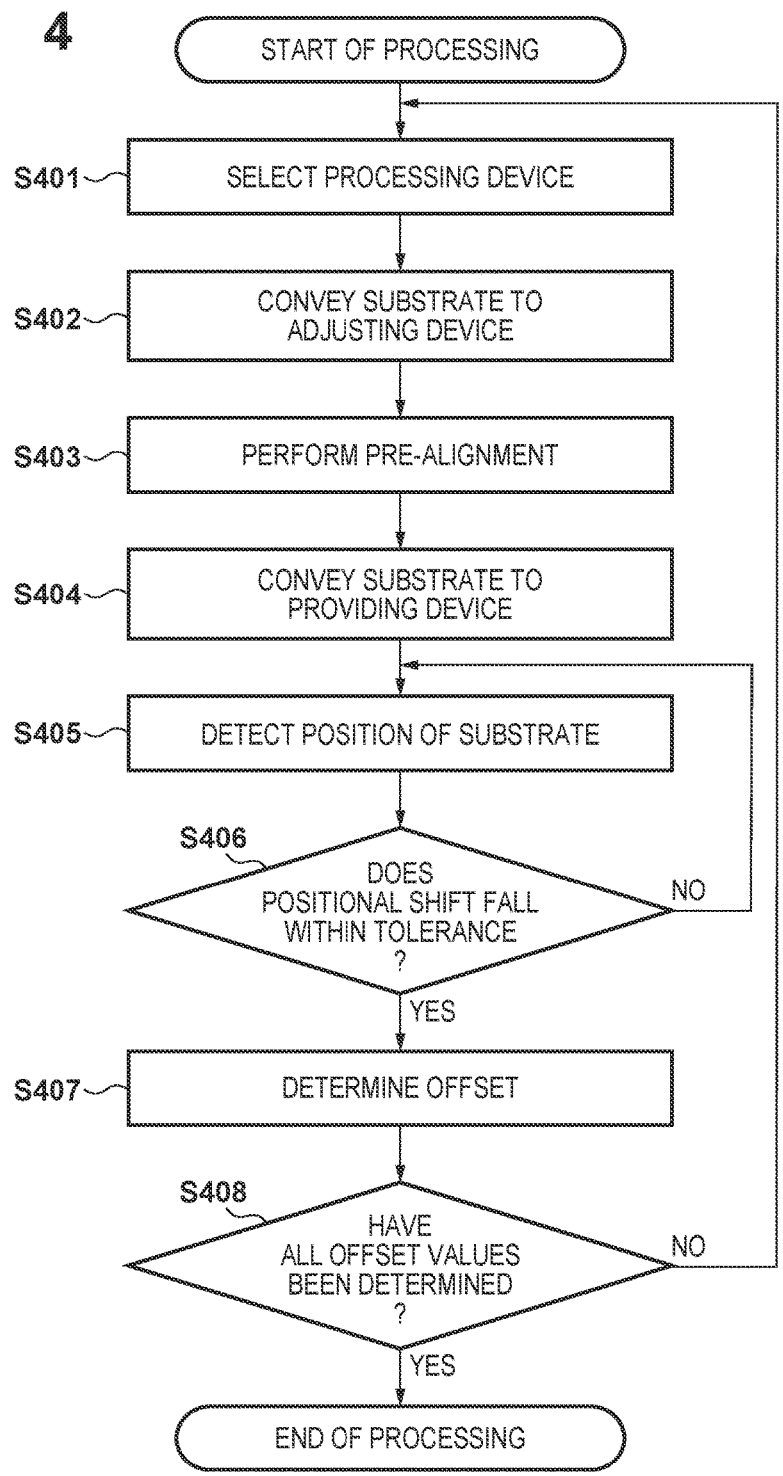
FIG. 4 is a flowchart illustrating offset determination processing according to the embodiment.

The execution timing of the offset determination processing of FIG. 4 can be set to, for example, a timing before the start of the operation of the substrate processing apparatus. The present invention, however, is not limited to this. For example, along with the operation of the apparatus, the offset value of the adjusting device may change due to the influence of a change with time, disturbance, or the like. Therefore, the offset determination processing may be performed regularly (for example, semiannually or annually), at the time of returning after a stop caused by a trouble in the apparatus, or at a timing when a positional shift amount obtained when the substrate position detector 11 measures the substrate S exceeds a predetermined threshold a predetermined number of times.

Figure 5:
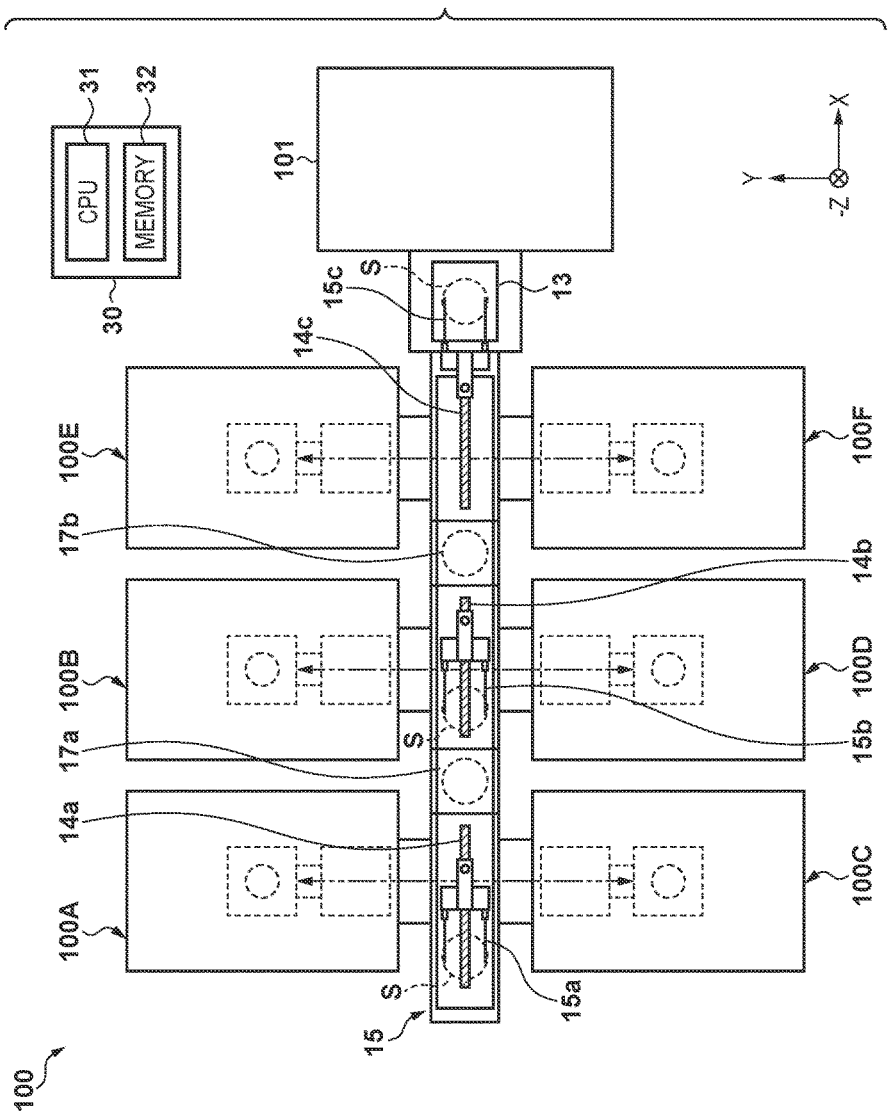
FIG. 5 is a view showing another schematic arrangement of the substrate processing apparatus according to the embodiment.

The arrangement of the four processing devices 100A, 100B, 100C, and 100D has been explained. An arrangement including a larger number of processing devices is also considered. Furthermore, the substrate processing apparatus 100 may have an arrangement including a plurality of adjusting devices 17, the number of which is smaller than the number of the plurality of processing devices. In this case, with respect to the conveying device 15 and the adjusting device 17, the arrangement is not limited to that shown in FIG. 1. An arrangement which includes a plurality of conveying devices 15 and a plurality of adjusting devices 17 in accordance with the number of substrates to be processed may be adopted. In this case, a plurality of conveying devices 15 and a plurality of adjusting devices 17 may be arranged for one conveyance path. In addition, a plurality of conveyance paths may be arranged. FIG. 5 shows an example in which three conveying devices 15a, 15b, and 15c, two adjusting devices 17a and 17b, and six processing devices 100A, 100B, 100C, 100D, 100E, and 100F are arranged.

Figure 9:
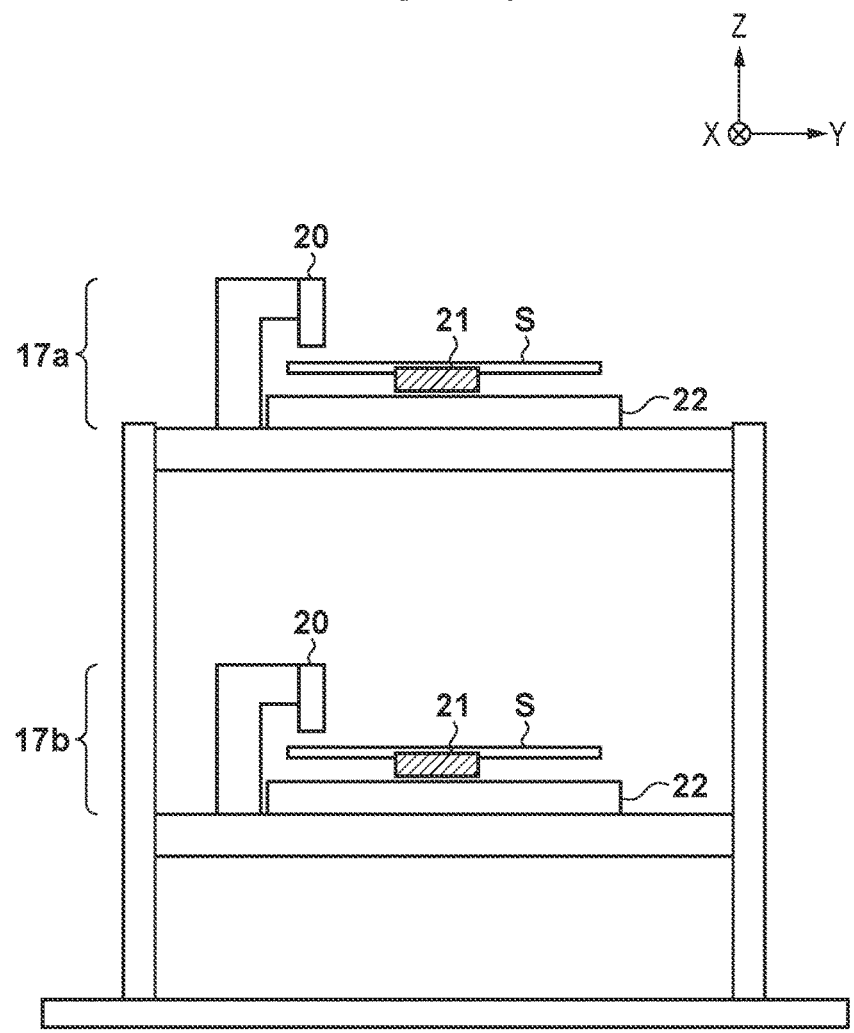
FIG. 9 is a view showing an example of the arrangement of two adjusting devices according to the embodiment.

The number of conveying devices and the number of adjusting devices can be freely changed. The plurality of adjusting devices 17 may be arranged in the plane direction with respect to the conveying device 15, or arranged to overlap in the height direction. FIG. 9 shows an example in which the two adjusting devices 17a and 17b are arranged to overlap in the height direction.

To improve the productivity, in FIG. 1, a conveyance port of the coating apparatus 101 is also added on the right side on the drawing to form the cluster structure (eight substrate processing devices in total) shown in FIG. 1 by setting the coating apparatus 101 as a boundary.

A substrate processing apparatus 100 according to another embodiment will be described with reference to FIGS. 6 and 7. A description of the same components and processing contents as in the above-described embodiment will be omitted.

Figure 6:
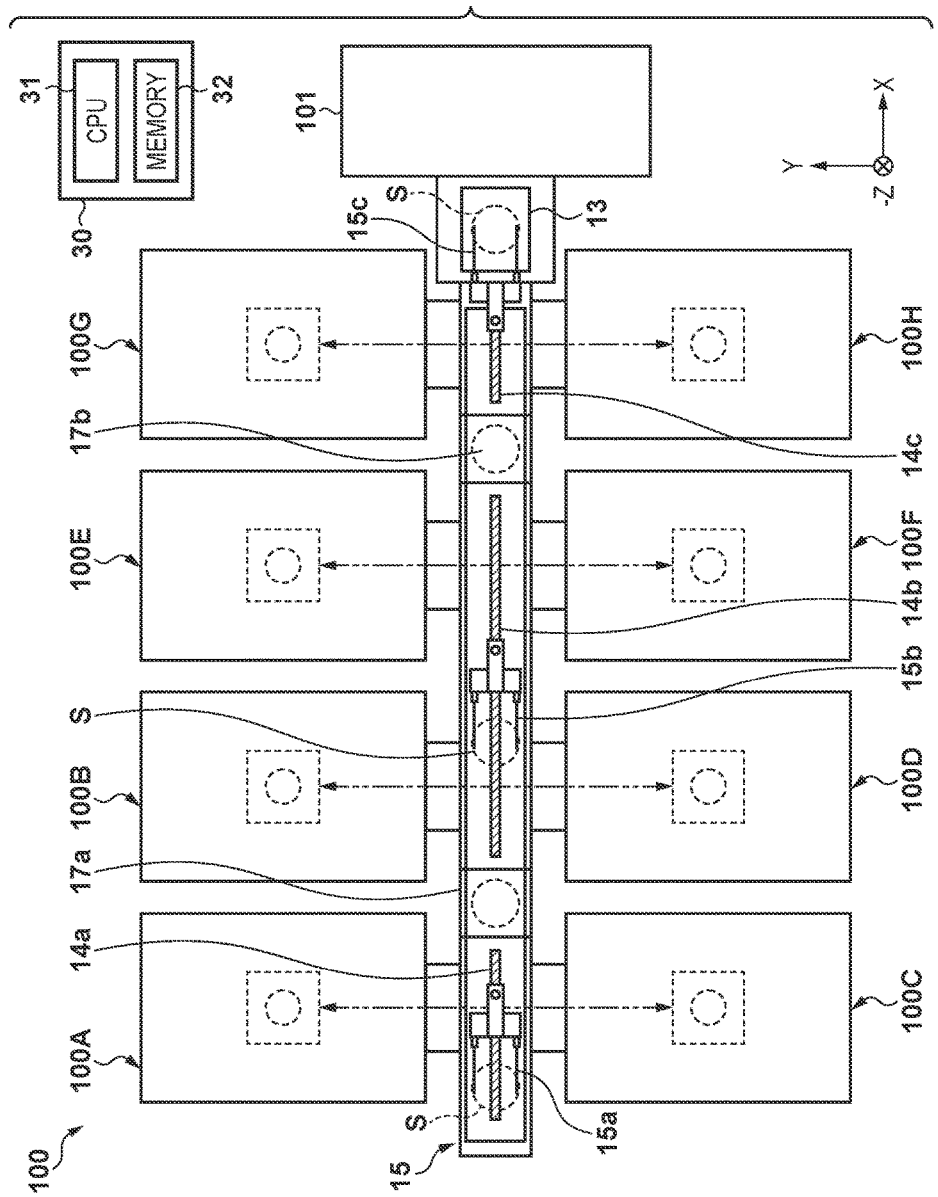
FIG. 6 is a view showing the schematic arrangement of a substrate processing apparatus according to another embodiment.
Figure 7:
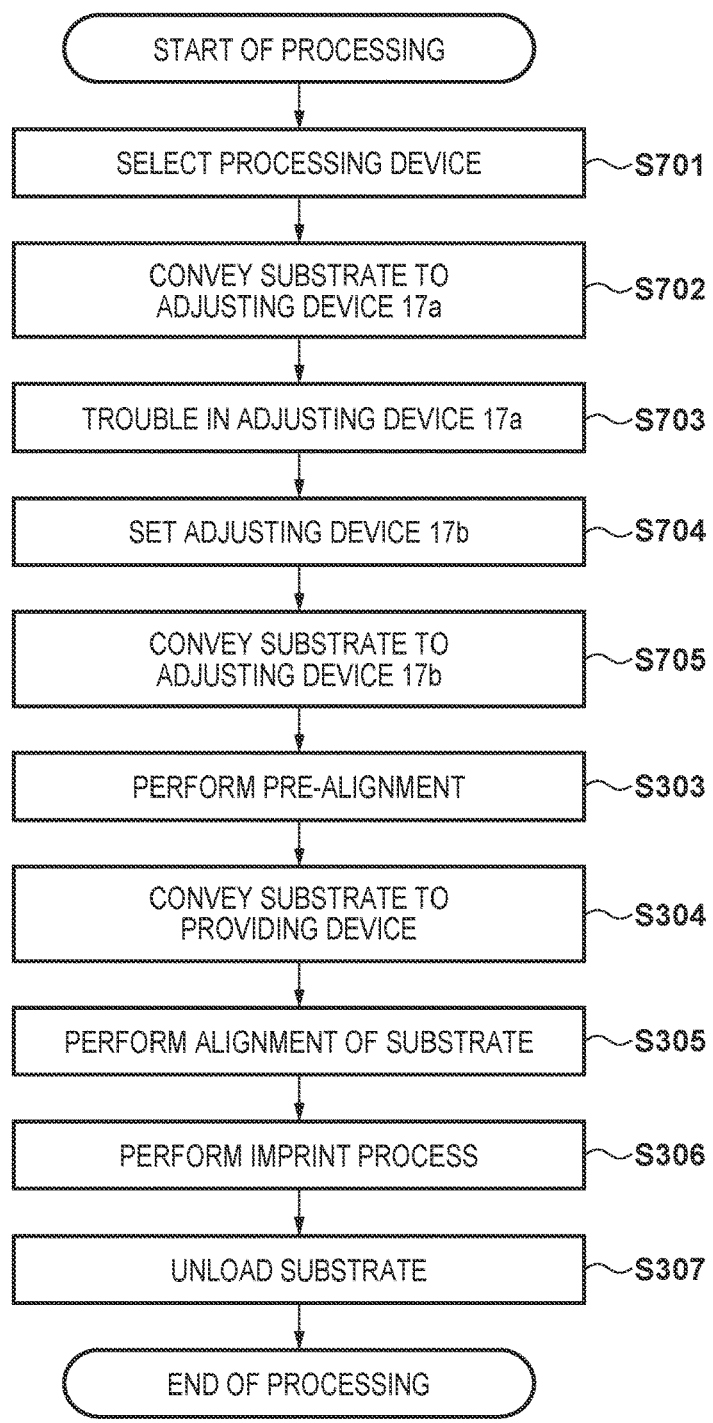
FIG. 7 is a flowchart for explaining the operation of the substrate processing apparatus according to the other embodiment.

FIG. 6 shows an example in which the substrate processing apparatus 100 includes eight processing devices 100A to 100H, three conveying devices, and two adjusting devices. The three conveying devices include a first conveying device 15a, a second conveying device 15b, and a third conveying device 15c. Furthermore, the two adjusting devices include a first adjusting device 17a and a second adjusting device 17b. FIG. 7 is a flowchart illustrating the operation of the substrate processing apparatus 100 shown in FIG. 6. After selecting a processing device in step S701, a substrate S is conveyed, in step S702, to the first adjusting device 17a using the second conveying device 15b and the third conveying device 15c. Assume that a trouble occurs in the first adjusting device 17a in step S703, and alignment cannot be executed. In this case as well, an imprint process can be performed in the arrangement shown in FIG. 6. For example, in step S704, a controller 30 sets, in the second adjusting device 17b, an offset value corresponding to the currently selected processing device. This offset value is read out from a memory 32. In step S705, the substrate S is transferred from the first adjusting device 17a to the second adjusting device 17b. After that, the same processes in steps S303 to S307 as those described with reference to FIG. 3 are performed. In this way, even if a trouble occurs in one of the plurality of adjusting devices, the adjusting device can be changed to another normal adjusting device to advance the processing of the substrate.

Note that to reduce the alignment error of the adjusting device more strictly, an offset value corresponding to each processing device may be determined for each pre-alignment.

As described above, in the substrate processing apparatus including the plurality of processing devices according to the embodiment, the correspondence relation between the plurality of adjusting devices and the plurality of processing devices is preset. For example, each adjusting device holds an offset value for each processing device. Then, each adjusting device positions a substrate in consideration of the offset value for each processing device. Based on the state of one of the plurality of adjusting devices, the controller 30 can change the offset value to change the correspondence relation. This can provide a low-end apparatus while suppressing the footprint without degrading the substrate alignment accuracy.

<Embodiment of Article Manufacturing Method>

A method of manufacturing a device (for example, a semiconductor integrated circuit device, a liquid crystal display device, or the like) as an article includes a step of forming a pattern onto a substrate (wafer, glass plate, or film-like substrate) using the above-described imprint apparatus. The manufacturing method also includes a step of processing (for example, etching) the substrate on which the pattern has been formed. Note that when manufacturing another article such as a patterned medium (recording medium) or an optical element, the manufacturing method can include, instead of etching, another processing of machining the substrate on which the pattern has been formed. When compared to the conventional methods, the article manufacturing method of this embodiment is advantageous in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-094153, filed May 9, 2016, which is hereby incorporated by reference herein in its entirety.

What is claimed is:

1. A substrate processing apparatus including a plurality of processing devices each of which processes a substrate, the apparatus comprising:
   a conveying device including a conveyance path and configured to convey, to one of the plurality of processing devices, a substrate conveyed into one end of the conveyance path from an outside of the substrate processing apparatus; and
   an adjusting device configured to perform adjustment of a pre-alignment state of the substrate conveyed from the one end before the substrate is conveyed into one of the plurality of processing devices,
   wherein the adjusting device is arranged on the conveyance path and between a processing device, of the plurality of processing devices, farthest from the one end, and a processing device, of the plurality of processing devices, closest to the one end, and
   wherein the conveyance path includes a first conveyance path and a second conveyance path which are separated by the adjusting device, and the conveying device includes a first conveying device configured to convey a substrate along the first conveyance path and a second conveying device configured to convey a substrate along the second conveyance path.

2. The apparatus according to claim 1, wherein the adjusting device includes a temperature regulator configured to perform temperature regulation of the substrate.

3. The apparatus according to claim 2, further comprising: a controller configured to cause the conveying device to convey the substrate having undergone the temperature regulation by the temperature regulator from the adjusting device to one of the plurality of processing devices.

4. The apparatus according to claim 1, wherein the adjusting device includes a container configured to contain a plurality of ones of the substrate.

5. The apparatus according to claim 4, further comprising: a controller configured to cause the conveying device to convey a substrate, of substrates contained in the container, having undergone the adjustment by the adjusting device from the container to one of the plurality of processing devices.

6. The apparatus according to claim 1, further comprising at least another one of the adjusting device, wherein a number of adjusting devices included in the apparatus is smaller than a number of processing devices included in the apparatus.

7. The apparatus according to claim 6, wherein a correspondence relation between ones of the adjusting devices and the plurality of processing devices is preset.

8. The apparatus according to claim 7, further comprising: a controller configured to change the correspondence relation based on states of the ones of the adjusting devices.

9. The apparatus according to claim 1, wherein each of the plurality of processing devices is configured to perform patterning on a substrate.

10. An article manufacturing method comprising:
    performing patterning on a substrate using a substrate processing apparatus;
    processing the substrate, on which the patterning has been performed, to manufacture the article,
    wherein the substrate processing apparatus includes
    a plurality of processing devices each configured to process a substrate,
    a conveying device including a conveyance path and configured to convey, to one of the plurality of processing devices, a substrate conveyed into one end of the conveyance path from an outside of the substrate processing apparatus; and
    an adjusting device configured to perform adjustment of a pre-alignment state of the substrate conveyed from the one end before the substrate is conveyed into one of the plurality of processing devices,
    wherein the adjusting device is arranged on the conveyance path and between a processing device, of the plurality of processing devices, farthest from the one end, and a processing device, of the plurality of processing devices, closest to the one end, and
    wherein the conveyance path includes a first conveyance path and a second conveyance path which are separated by the adjusting device, and the conveying device includes a first conveying device configured to convey a substrate along the first conveyance path and a second conveying device configured to convey a substrate along the second conveyance path.

11. A substrate processing apparatus including a plurality of processing devices each of which processes a substrate, the apparatus comprising:
    a conveying device including a conveyance path and configured to convey, to one of the plurality of processing devices, a substrate conveyed into one end of the conveyance path from an outside of the substrate processing apparatus; and
    an adjusting device configured to perform adjustment of a pre-alignment state of the substrate conveyed from the one end before the substrate is conveyed into one of the plurality of processing devices, wherein the adjusting device is arranged on the conveyance path and between a processing device, of the plurality of processing devices, farthest from the one end, and a processing device, of the plurality of processing devices, closest to the one end, and wherein the adjusting device includes a container configured to contain a plurality of ones of the substrate.

12. An article manufacturing method comprising:

performing patterning on a substrate using a substrate processing apparatus;

processing the substrate, on which the patterning has been performed, to manufacture the article, wherein the substrate processing apparatus includes:

a plurality of processing devices each configured to process a substrate, a conveying device including a conveyance path and configured to convey, to one of the plurality of processing devices, a substrate conveyed into one end of the conveyance path from an outside of the substrate processing apparatus; and an adjusting device configured to perform adjustment of a pre-alignment state of the substrate conveyed from the one end before the substrate is conveyed into one of the plurality of processing devices, wherein the adjusting device is arranged on the conveyance path and between a processing device, of the plurality of processing devices, farthest from the one end, and a processing device, of the plurality of processing devices, closest to the one end, and wherein the adjusting device includes a container configured to contain a plurality of ones of the substrate.

13. A substrate processing apparatus including a plurality of processing devices each of which processes a substrate, the apparatus comprising:

a conveying device including a conveyance path and configured to convey, to one of the plurality of processing devices, a substrate conveyed into one end of the conveyance path from an outside of the substrate processing apparatus; and an adjusting device configured to perform adjustment of a pre-alignment state of the substrate conveyed from the one end before the substrate is conveyed into one of the plurality of processing devices, wherein the adjusting device is arranged on the conveyance path and between a processing device, of the plurality of processing devices, farthest from the one end, and a processing device, of the plurality of processing devices, closest to the one end, and wherein the substrate processing apparatus comprises at least another one of the adjusting device, wherein a number of adjusting devices included in the apparatus is smaller than a number of processing devices included in the apparatus.

14. An article manufacturing method comprising:

performing patterning on a substrate using a substrate processing apparatus;

processing the substrate, on which the patterning has been performed, to manufacture the article, wherein the substrate processing apparatus includes:

a plurality of processing devices each configured to process a substrate, a conveying device including a conveyance path and configured to convey, to one of the plurality of processing devices, a substrate conveyed into one end of the conveyance path from an outside of the substrate processing apparatus; and an adjusting device configured to perform adjustment of a pre-alignment state of the substrate conveyed from the one end before the substrate is conveyed into one of the plurality of processing devices, wherein the adjusting device is arranged on the conveyance path and between a processing device, of the plurality of processing devices, farthest from the one end, and a processing device, of the plurality of processing devices, closest to the one end, and wherein the substrate processing apparatus comprises at least another one of the adjusting device, wherein a number of adjusting devices included in the apparatus is smaller than a number of processing devices included in the apparatus.

* * * * *